United States Patent [19]

Keller

[11] 3,726,007

[45] Apr. 10, 1973

[54] COMPONENT SIDE PRINTED CIRCUIT SOLDERING

[75] Inventor: Joseph D. Keller, Orange County, Fla.

[73] Assignee: Martin Marietta Corporation, New York, N.Y.

[22] Filed: Feb. 2, 1971

[21] Appl. No.: 111,965

[52] U.S. Cl. ..................29/626, 29/471.1, 29/471.3, 29/503

[51] Int. Cl. ..............................................H05k 330

[58] Field of Search..........................29/471.1, 471.3, 29/472.3, 503, 589, 626; 228/36, 37, 40

[56] References Cited

UNITED STATES PATENTS

| | | | |
|---|---|---|---|
| 2,842,841 | 7/1958 | Schnable | 29/503 X |
| 2,870,532 | 1/1959 | Young | 29/471.1 |
| 2,927,251 | 3/1960 | Jones et al. | 29/626 X |
| 3,020,635 | 2/1962 | Redgrift | 29/503 X |
| 3,214,827 | 11/1965 | Phohofsky | 29/503 X |
| 3,294,951 | 12/1966 | Olson | 29/626 X |
| 3,298,588 | 1/1967 | Shomphe | 228/36 X |
| 3,383,455 | 5/1968 | Kerby, Jr. | 29/626 |
| 3,461,552 | 8/1969 | Wolf et al. | 29/626 |
| 3,479,736 | 11/1969 | Toki et al. | 29/589 X |
| 3,486,223 | 12/1969 | Butera | 29/626 |

*Primary Examiner*—J. Spencer Overholser
*Assistant Examiner*—Richard B. Lazarus
*Attorney*—Julian C. Renfro, Martin Marietta and Gay Chin

[57] ABSTRACT

A method of securing at least one multilead electronic component upon a supporting medium in an electrically correct manner, involving the leads of the component to a large extent disposed on the same side of the supporting medium or board as the component, with the component itself being passed through molten solder during the soldering of the component leads to the circuitry of the supporting medium. Because the necessity of through holes in the supporting medium is thus essentially eliminated, the practice of my method can result in the manufacture of circuit boards having an extremely high component density, with this method also making possible the use of wave solder techniques, and therefore the production of high density circuit boards and the like in a very rapid manner.

A novel circuit board is also taught herein, involving at least one multilead component placed on a supporting medium with its lead terminations to a large extent located on the same side of the supporting medium as the component itself. Single sided as well as double sided boards of high density can be made in this manner.

16 Claims, 4 Drawing Figures

INVENTOR
JOSEPH D. KELLER

BY Julian C. Renfro
ATTORNEY

COMPONENT SIDE PRINTED CIRCUIT SOLDERING

BACKGROUND OF THE INVENTION

This invention relates to a novel method of attaching electrical components to printed circuit boards utilizing wave or dip soldering techniques, and more particularly to a novel procedure making possible the soldering of components to single sided or double sided circuit boards in a much more rapid and satisfactory manner than previously possible, while at the same time achieving a packaging density much higher than ordinarily obtained by using multilayer printed circuit boards.

The hand soldering of resistors, capacitors, transistors and the like to printed circuit boards has gradually given way to the attachment of components by dip soldering and wave soldering techniques, and the patent application of Osborne and Keller, Ser. No. 551,475, now U.S. Pat. No. 3,605,244, issued Sept. 20, 1971, teaches a wave or flow soldering technique that has been successfully used in the manufacture of a large number of boards. However, previous wave solder techniques have largely been concerned with the attachment of components to circuit boards by extending the leads of the components through holes provided in the board for that purpose, and then passing the side of the board containing the lead terminations through a wave of molten solder, with the temperature and other environmental factors utilized in such an arrangement causing the component leads to attach to the circuit paths at desired locations. Usually a separate hole has been utilized for each component lead to be accommodated, with two holes thus being required for each resistor or capacitor, and three holes needed for the leads of active components such as transistors.

It should be noted that with increased demands for circuit density, circuits were added to both sides of the printed circuit boards, with component leads passing through holes provided in the board serving to interconnect the top and bottom circuitry. Initially, the top sides of these boards were hand soldered, and the bottom sides were pot soldered, but gradually wave soldering techniques were substituted for the pot soldering. Then, feed throughs were utilized in the double sided boards, which enabled hand soldering of the tops to be eliminated, and made it possible for the entire board to be soldered by passing through a molten solder wave by virtue of the fact that the solder wicked up through the holes. One successful technique involved the use of split eyelets, constructed along lines set forth in the Keller U.S. Pat. No. 3,190,953. Another technique has involved the use of so called plated through holes, with the interior of such holes being plated say with copper.

As circuit density demands grew, it became desirable to go to multilayer boards, in which inner layers of printed circuit conductors were included in the printed circuit configuration. The holes used in such arrangements not only permitted the passage of component leads, but also were plated to assure proper electrical interconnections throughout the several layers of the board. Wave soldering techniques could still be used, but it was necessary to place all components in the nature of conventional resistors, capacitors, and transistors on the side of the board away from the solder wave, for components of that type could not withstand direct contact with molten solder inasmuch as the electrical and mechanical properties were significantly degraded. For example, electrical values may shift, the component bodies can pick up solder, and actual melting of structural members in the component body can take place under the conditions brought about by passing through the molten solder. It is therefore to be seen that a large number of holes had to be utilized through which component leads could pass, unless hand soldering on the top side was to be resorted to, or a solder reflow arrangement utilized.

All of the procedures mentioned heretofore became very much more complicated when integrated circuit semiconductor crystals mounted in packages called flatpacks were to be utilized. These units contain a number of different circuits involving complete electrical functions integrated into the semiconductor crystal with the individual identity of discrete resistive, capacitive, etc. elements not easily visible, or for that matter accessible. Consequently, the flatpack units necessarily require a multiplicity of external leads for interconnection purposes.

One typical flatpack type component involves seven leads extending from each end of the component, and 48 lead flatpacks, involving 12 leads on each of four sides, are not uncommon. When it was desired to solder one or more of such flatpacks to a multilayer printed circuit board in a conventional and rapid manner, a comparatively large number of closely spaced holes usually had to be provided in the board, which necessarily cut down upon the circuit packaging density that could be achieved. This is of course because when predrilling the board with a number of holes, the number and location of components to be placed on the board needed to be rearranged and adjusted according to available interconnecting circuitry. Furthermore, when placing these holes through these boards to accommodate the numerous leads associated with the flatpacks, it was necessary in order to assure circuit continuity to plate through all the holes, which manifestly was a time consuming procedure that necessitated considerable expense in hole preparation to achieve plating reliability, as these holes are usually only 20 to 30 mils in diameter and may interconnect 10 to 20 layers of circuitry.

Thus, as density requirements dictated the placement of flatpacks on both sides of the printed circuit boards, it became necessary to make certain decisions as to the constructional techniques to be followed. On the one hand, great density could be obtained in accordance with recent prior art techniques by not using up board space with numerous holes. In other words, the holes used could be limited to those employed to interconnect the various circuit levels of the boards, but this has in the past only been achievable by using hand solder techniques or reflow techniques to achieve a soldering of all connections on both sides of the board, and this quite obviously was only able to be brought about at comparatively great cost.

On the other hand, reasonable cost and good production speed could be obtained by going to known wave soldering procedures, but as previously indicated, this required in the past a large number of through holes through which solder could flow upwardly, and such an arrangement necessarily represented a sacrifice with regard to the density able to be achieved by the slower methods.

SUMMARY OF THE INVENTION

With the advent of integrated circuits, we have discovered that with their internal thermal compression bonded interconnections, nonmetallic bodies and advanced glass-to-metal component lead seals, direct contact of molten solder with such components is now possible and feasible.

Thus, in accordance with the present invention, I am teaching, describing and claiming a novel method involving the circuit components being placed on the same side of the circuit board on which the leads are terminated, or in other words, components being placed so as to be passed directly through the molten solder wave as the lead terminations are soldered to the circuit paths of the board. Each side of the board is of course passed through the solder wave when flatpacks are to be installed on both sides of the board.

Although the components necessarily have to withstand momentarily the temperature of the molten solder, this procedure makes it possible for the leads to be secured directly to the circuit paths without such leads having to pass through holes in the board. This of course makes possible the utmost in printed circuit density, for the only holes necessary to be placed on the board are those needed for interconnecting the various layers on the board.

Quite advantageously, established wave soldering methods are permitted, without any significant changes in the equipment already used for wave soldering conventional components to printed circuit boards being necessitated in order that this invention be practiced.

In accordance with this invention, the component bodies may be attached to the circuit boards either mechanically or adhesively as may be preferred, with any adhesive used being of such a nature as to survive passing momentarily through the solder wave.

Many other advantages than those mentioned above are made possible by the practice of this invention, such as use by small manufacturers who may wish to secure flatpack components to multilayer circuit boards, but who have no plated-through-hole facility. In accordance with this invention, such a manufacturer without going to such expense can nevertheless manufacture circuitry having requisite high density.

Another advantage involves the elimination of the above-mentioned solder reflow techniques, for although the precoating of leads and circuit paths with solder and the subsequent application of heat can bring about the securing of component leads in the precise locations sought, the reliability of a reflow joint is very much a function of the thickness of the preapplied bonding material, which thickness is difficult to control. Further, during a reflow procedure, a fillet is achieved which is difficult to inspect, and differs in appearance from solder joints made by previously known art. In contrast, the joints formed in accordance with the present novel method are identical to the joints made by entirely conventional wave solder procedures, standards for which exist in both military specifications and commercial workshop manuals used to establish wave solder joint excellence.

Advantageously, the uncertainties associated with unknown precoating thicknesses and other facets of the known reflow techniques are eliminated in accordance with this invention inasmuch as solder is drawn into the joints between the component leads and the circuit paths by capillary action brought about by the natural joint function formed by the flatpack lead lying against the printed conductor.

Significantly, the present invention can be practiced utilizing equipment of several known types. For example, the wave solder machine can be one having a unidirectional wave brought about by the use of a deflector arrangement as taught in the Osborne and Keller application cited above, or alternatively the solder wave can be a bidirectional symmetrical wave of the type utilized in commercially available machines such as manufactured by Hollis Engineering, Inc. of Nashua, New Hampshire.

Oil may be flowed onto the wave as taught in the Osborne and Keller application in order to reduce the surface tension of the solder, thus eliminating the tendency for the solder to bridge or form icycles between the closely placed circuitry as the board exits from the solder wave. Alternatively, the present invention may be practiced with machines that intermix oil with solder prior to the ejection of solder at the nozzle, which technique is of course utilized in the Hollis machines. The advantages surrounding the use of oil become increasingly important as circuit density increases and fine line, closely placed circuit conductors are utilized.

It is therefore a primary object of this invention to teach a method for interconnecting components to a supporting means such as a circuit board or other form of substrate through direct exposure of the component side of the supporting means to molten solder, thus making possible the achieving of very high component densities at lowest cost.

It is another important object of this invention to eliminate the large number of holes previously used in circuit boards or cards in the process of securing by mass joining methods, the many leads of integrated circuit components or the like to circuit paths or other wiring on the board.

It is still another important object to bring about the soldering of numerous component leads to circuit paths without it being necessary to precoat such locations with solder and utilize reflow techniques.

It is yet another object of this invention to provide an extremely rapid and low cost method for securing components to multilayer circuit boards without necessitating a plated through hole facility.

It is yet still another object of this invention to obtain desirable circuit density without it being necessary to depart from established inspection methods for joint configurations, or from established wave solder methods.

These and other objects, features and advantages will be more apparent from a study of the enclosed drawings in which.

DETAILED DESCRIPTION

Figure 1:
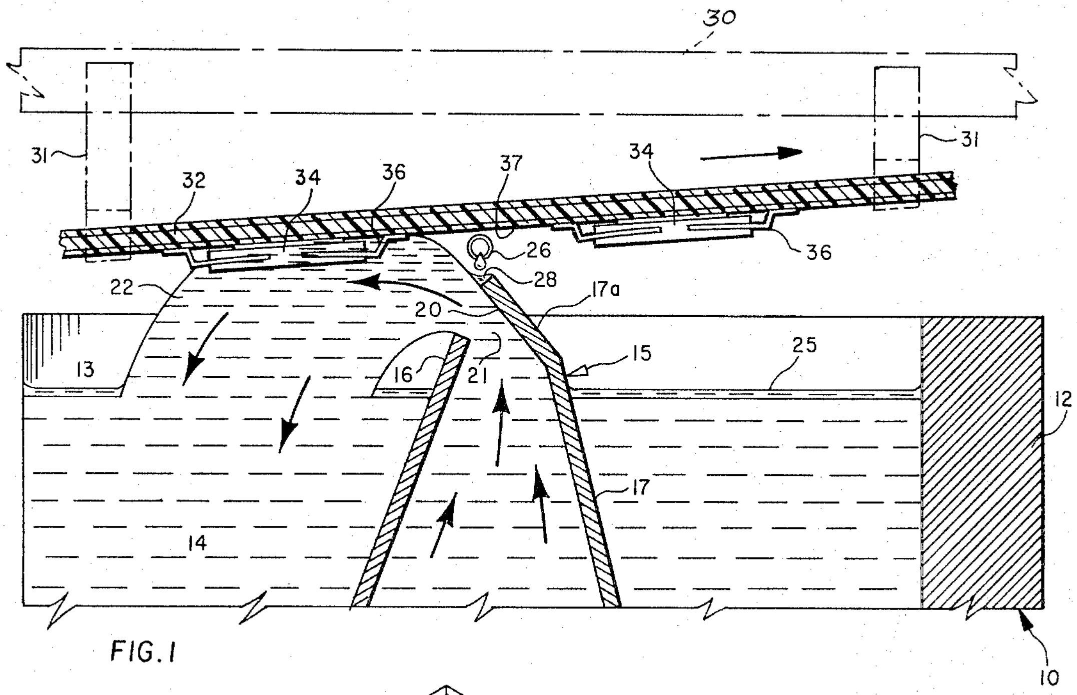
FIG. 1 is a vertical sectional view of a soldering apparatus of the type that may be utilized in carrying out my novel method, with a component carrying board being shown passing through the molten solder wave.

Referring to FIG. 1, it will there be seen that I have shown a tank 10 having end walls 12 and side walls 13, with only one of each such walls being illustrated in this figure. The tank may be rectangular, and made of suitable refractory material so that it can contain a body of molten solder 14, which may for example be a 60 – 40 tin-lead solder maintained at say 500° F. Disposed in the tank is a solder projecting nozzle 15 to be utilized in soldering the connections of a printed circuit board 32 caused to pass through the crest of the solder wave 22 created by the nozzle 15.

The nozzle 15 may have a sloping front wall 16 and a sloping rear wall 17 disposed between the illustrated side wall 13, and the wall opposite it. The upper portion **17*a* of rear wall 17 may extend above front wall 16 and is bent forwardly to provide a solder deflecting surface 20 disposed above elongated solder discharge orifice 21. The solder discharge orifice 21** may be generally rectangular, and the solder deflecting surface is preferably disposed at an angle of approximately 47° to the vertical, but neither of these criteria are to be construed to be limiting, nor are they concerned with the vital aspects of the present invention.

Solder is withdrawn from the lower portion of the body of solder in tank 10, and forced by pump means (not shown) upwardly through nozzle 15 and out discharge orifice 21 to form a curvilinear stream 22 of molten solder, which returns to the main portion of the tank. Any suitable solder pumping means may be used for effecting the discharge from nozzle 15, for example such as the pump disclosed in U.S. Pat. No. 2,993,272. It is necessary that the solder issue with sufficient force to rise a distance above the edge of the wall portion **17*a***.

In order to prevent oxidation of the surface of the body of solder within the tank 10, a layer of oil 25 may be floated on the surface of the solder, or alternatively, oil may be intermixed with the solder. If the solder-oil intermix is not used, I may utilize an arrangement in which one or more oil feeder ducts 26 discharge a small flow of oil in the form of a mere trickle of droplets into what amounts to a small reservoir 28. This reservoir is substantially V-shaped in cross-section and may be regarded as being defined between the sloping upper edge of wall portion **17*a* and the moving surface of the molten solder stream itself. The reservoir 28 is approximately the same width as the solder stream, and its position and arrangement are such that the moving surface of the stream 22 is wiped by the oil as solder issues from the nozzle 15**. The surface of the stream thus picks up a thin film of oil, on the order of several molecules in thickness, that serves as an effective barrier to the air which would oxidize the solder, as well as increasing the surface tension thereof, the latter being a condition which adversely affects the forming of good solder joints. Thus, it is to be understood that oil applied as described herein, and in the above-cited Osborne and Keller patent application, decreases surface tension and promotes the formation of good solder joints.

Before the use of oil, backwash solder accumulated and spilled or ran along conductors in the direction of board travel, and caused "icicles" and bridging of the conductors together in an undesirable manner. This condition was aggravated by the formation of a tenacious solder oxide film on the backwash solder, causing excess solder to cling to the leads and connectors instead of breaking away from the joints at the region of separation of the board from the stream crest or backwash area. The use of oil eliminates this, and makes possible the formation of good solder joints. However, in some instances it may be desirable to eliminate the oil, thus to minimize the post-soldering cleanup of the boards.

In accordance with the present invention I have made provision for passing the printed circuit board or panel 32 at an appropriate speed in contact with the crest of the stream or wave 22 of liquid solder. This board may be carried by a plurality of depending hook members 31 which grip the edges of the circuit board or workpiece, and carry it in the proper attitude past the molten solder stream, thus to effect the soldering of components mounted thereon. The hooks 31 may be part of a chain type conveyor 30 or the like, whose speed can be adjusted. Alternatively, the board may be gripped along its entire left and right edges.

As previously indicated, this invention comprehends the use of components mounted either on one side of the board or on both sides, with the components in each instance mounted so as to be on the same side of the board as are the respective terminating lead ends. This of course means that soldering of the leads to the circuitry of the board is accomplished during the time the components themselves pass through the solder wave.

Whereas the components of yesteryear would have been adversely affected by passing through molten solder, I have found after conducting a number of tests, that the integrated circuit components known as flatpacks presently on the market can successfully briefly withstand the temperature of the molten solder without changing their electrical values, or in any other known way being adversely affected. Accordingly, I may dispose components at numerous locations on the printed circuit boards, such as flatpacks 34, which are disposed on the side of the board shown passing through the crest of the solder wave. These components are equipped with leads 36 extending so as to be aligned with the metallic circuit paths or conductor strips 37 arranged in a predetermined pattern on the board; see FIG. 3. Significantly, these leads 36 do not pass through the board, but rather their terminating ends are on the same side of the board as are the respective component bodies.

As should now be apparent, the terminal portions of the lead wires are adapted to be soldered to the conductor strips 37 of the circuit board, to provide good electrical connections between the circuitry of the flatpacks, and the circuitry of the board, this of course taking place as the board and the components thereon are caused to pass through the solder wave. The speed of the board may depend upon a number of conditions such as circuit configuration and design, and the speed may approximately be within the 1 – 4 ft./min. range.

It is most important to note that although I have shown components to reside only on one side of the board 32, it is entirely within the contemplation of this invention to dispose components on two sides of the board, and to run each board through the solder wave twice so as to effect the proper soldering of both sides. It is also important to note that as previously mentioned, my novel method can be practiced by passing circuit cards or boards through either a unilateral or a bilateral type solder wave, with oil either being used in an intermixed manner, or as applied to the solder wave at a location upstream of a board or card to be soldered by the wave.

Figures 2, 3:
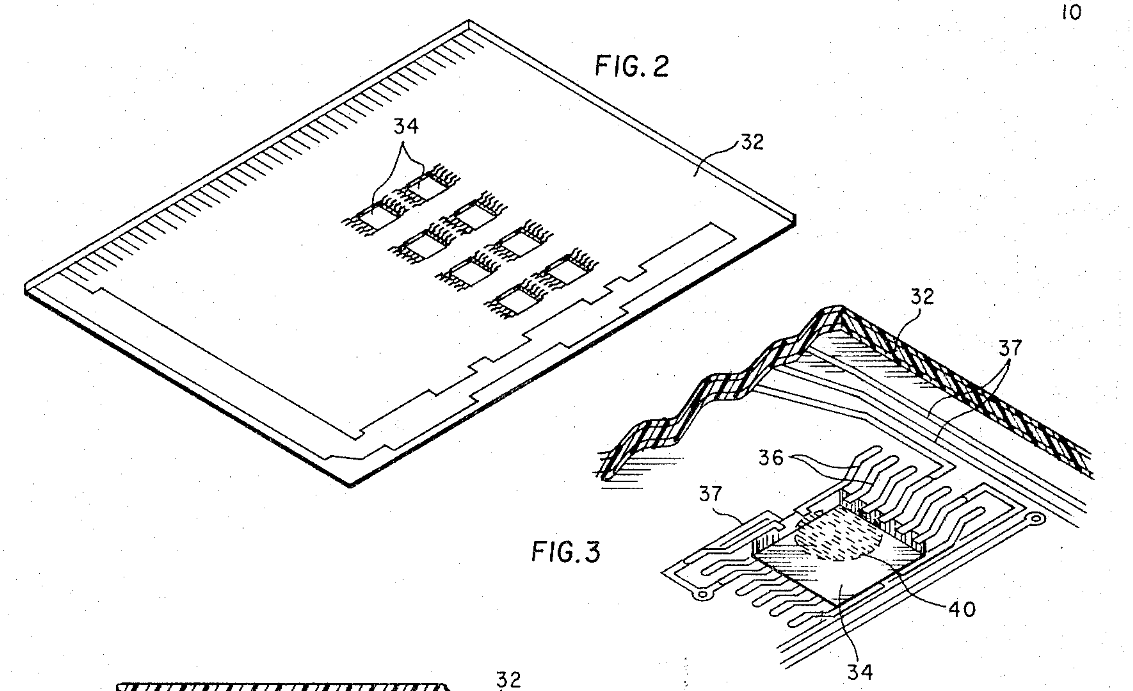
FIG. 2 is a perspective view of a printed circuit board of the type shown in FIG. 1, but to a somewhat different scale, with this figure illustrating the general arrangement of flatpacks on one side of the board.
FIG. 3 is a fragmentary view to a larger scale than in FIG. 2, with this view illustrating the manner in which lead terminations are in contact with the circuit paths on the circuit board.

Turning now to FIG. 2, it will be noted from this simplified showing that a number of electronic components such as integrated circuit flatpacks can be disposed in a suitable array. The number of components on a given board can of course be much larger than indicated on this figure.

An arrangement in which the flatpack units are closely spaced with the component leads terminating on the component body side of the board provides maximum electronic package density. Component placement arrangements may of course include some component leads placed in holes which pass through the printed circuit board.

FIG. 3 reveals in greater detail the manner in which the numerous leads 36 emanating from a typical flatpack 34 are attached at selected locations to respective circuit paths 37 of a board. The circuit path arrangement has been simplified in the interests of clarity, with it to be understood that in most if not all instances, each lead 36 is to be secured by a wave solder procedure to a circuit path forming a portion of an electronic circuit.

By the use of phantom lines in FIG. 3, it is indicated how a suitable adhesive 40 may be utilized to mechanically attach each component to the board in the appropriate location preparatory to passing the board through the molten solder wave 22. This adhesive can for example be Eastman 910 or the like. However, I am not to be so limited, and for example the flatpack body can be held in the appropriate position with respect to the circuitry of the board by the use of a mechanical holder, which may be for example in contact with the leads of the component, to hold them in the correct position.

The use of a mechanical holder is advantageous from the heat sink standpoint. This is to say, heat transfer paths are available when using such a holder, so that heat applied during the flow solder operation is rapidly dissipated. However, this usually is not too important a consideration, for except in the instance in which the flatpacks contain extremely sensitive circuitry from the heat standpoint, a heat dissipating arrangement is not necessary. This is because the crystals and substrates of the integrated circuits are sufficiently protected by the inherent packaging arrangement of the flatpack as to render the flatpacks relatively insensitive to the temperature of the molten solder for the time the integrated circuit is passing through the molten solder wave.

It should be noted that in most instances, the external leads are connected to the semiconductor crystal by ultrasonically welded aluminum wires, thermally compressed gold wires, or the like, usually of a diameter of 1 mil or less. For the time the heat resistant bodies of the flatpacks or other components are in the solder wave, the fine internal wires are unable, due to their small cross-section, to carry a damaging amount of heat to a semi-conductor junction. Also, the surface area of the fine wire with regard to its cross-section represents a very favorable ratio from the geometry standpoint, insofar as the radiation of heat is concerned.

Figure 4:
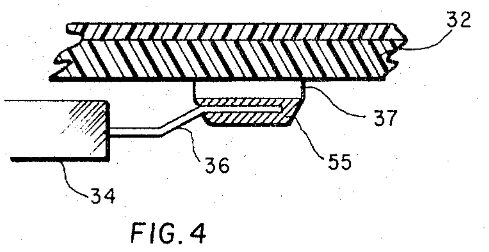
FIG. 4 is a cross sectional view to a large scale revealing how a typical lead of a typical integrated circuit is secured to one of the circuit paths of the board.

FIG. 4 shows in still larger detail the manner in which a typical lead 36 of a component 34 may be secured by a solder fillet 55 to a circuit pad or path 37 of the board 32.

It should now be apparent that I have described certain apparatus that would enable the novel method in accordance with this invention to be followed in securing cased or otherwise thermally protected electronic components upon a supporting medium or substrate in a very dense, yet rapid and electrically correct manner. Other apparatus than that illustrated may of course be used.

Such a method may comprise the steps of placing at least one such component having a plurality of leads upon a first surface of the supporting medium, with the terminations of the leads being disposed in electrically correct positions and to a large extent terminating on said first surface. The supporting means, which may for example be a printed circuit board, wiring board, terminal board, or any of a number of different substrates of thick film or thin film can then be passed through molten solder to effect the soldering of the leads to appropriate locations on the supporting medium, while at the same time exposing briefly the components to the molten solder.

Although I have referred on a number of occasions hereinbefore to the cased or protected components being integrated circuits, it should be borne in mind that a wide variety of components can be successfully passed through a solder wave briefly, such as, for example, the components may be dual in line (D.I.P.) integrated circuits, TO 5 on TO 8 components, or even discrete components that have an exterior that is largely solder resistive such as ceramic, metal, or a combination of these materials.

It should be realized that many of the components referred to hereinbefore involve devices in which a glass-to-metal seal is utilized. Such a seal is effected subsequent to the inclusion of the circuitry, and inasmuch as the heat utilized is maintained in the temperature range of 600° to 650° F for several minutes, this means that the circuitry of a given sealed component is exposed to less heat and for a shorter time during the wave soldering operation than it was during its manufacture. The wave soldering temperature is usually 500° F but may be lower, depending on the solder alloy selected. Wave solder temperatures are applied to termination sites for a short period of time, usually for a 1 to 2 second period.

This invention of course contemplates the placement of components on one or both sides of the board, with the lead terminations of each component still being on the same side of the board as the component, thus necessitating each board being passed through the molten solder either once or twice, depending whether components are utilized on one or both sides of the board. The soldering of such components can be effected without it being necessary to provide holes in the board, through which leads can pass from one side of the board to the other, although the possibility of leads being placed in holes is not to be regarded as excluded. Further, the present method significantly reduces handwork and operator soldering variables.

The practice of my novel method makes it possible to produce a novel board or substrate involving a comparatively small number of through holes and a high circuit density, upon one side of which device at least one multilead component is to be disposed. The lead terminations of such component are to a substantial extent disposed on the same side of the board or device as the one upon which the component is located, so accordingly, the soldering of such lead terminations to the circuit paths of the board involves immersing the terminations as well as the component in molten solder for a limited time.

Double sided circuit boards can also be produced, with components disposed on both sides of the device, and with most of the terminations of the components located on the same side of the board as the components themselves.

I claim:

1. A method of securing electronic components upon a supporting medium or substrate comprising the steps of placing at least one component having a plurality of leads upon a first surface of the supporting medium, with the leads being disposed in electrically-correct positions and to a large extent terminating on said first surface, and passing said first surface through molten solder to effect the soldering of the leads to appropriate locations on said supporting medium, and at the same time the component is contacted by the molten solder.

2. The method as defined in claim 1 in which said component is to be secured to a supporting medium in the form of a wiring board.

3. The method as defined in claim 1 in which said component is an integrated circuit flatpack that is to be secured to a supporting medium in the form of a printed circuit board.

4. The method as defined in claim 1 in which said component is to be secured to a terminal board.

5. The method as defined in claim 1 in which said component is to be secured to a thick film or thin film substrate.

6. The method as defined in claim 1 in which said component is a discrete device whose exterior is largely ceramic.

7. The method as defined in claim 1 in which said component is a discrete device whose exterior is largely metallic.

8. The method as defined in claim 1 in which said component is a discrete device whose exterior is largely plastic.

9. The method as defined in claim 1 in which said component is a discrete device whose exterior is formed from a combination of materials.

10. The method as defined in claim 1 in which said molten solder is in the form of a wave.

11. The method as defined in claim 1 in which at least one component is disposed on each surface of said supporting medium, with each surface being passed through molten solder in order to effect the soldering of lead terminations.

12. A method of securing electrical components onto a component board in the electrically correct manner, comprising the steps of placing at least one component body having a number of leads on a first surface of the board, said leads to a large extent terminating on said first surface rather than on the opposite surface, passing said board into a wave of molten solder such that a soldering of the lead terminations to appropriate locations on said first surface of the board is effected, with said solder wave at the same time also contacting said electrical component body, whereby few if any connections between said component and the board need to be made on said opposite surface of said board.

13. The method as defined in claim 12 in which at least one component is also to be secured to the other or second surface of said board, involving therefore the additional step of passing said second surface through the molten solder to effect the soldering of its lead terminations.

14. A method of electrically attaching electrical components to a circuit board without it being necessary to predrill the board comprising the steps of placing on one side of the board, at least one electrical component having a plurality of leads, positioning the leads of said component in contact with various circuit locations on said board, passing said board in contact with molten solder to accomplish the soldering of the leadS to the circuit locations, said molten solder at the same time being in contact with said electrical component, said soldering thus taking place on the same side of the board as said component, and making it unnecessary to accomplish the passing of the leads through the board for the creation of solder joints.

15. The method as defined in claim 14 in which a large plurality of components are arrayed on said first surface of said board, with the absence of predrilled holes making possible a great circuit density.

16. The method as defined in claim 15 in which a large plurality of components are arrayed on both board surfaces.

* * * * *